United States Patent
Saito et al.

(10) Patent No.: US 10,367,091 B2
(45) Date of Patent: Jul. 30, 2019

(54) SEMICONDUCTOR SWITCHING ELEMENT (71) Applicants: TOYOTA JIDOSHA KABUSHIKI KAISHA, Toyota-shi, Aichi (JP); DENSO CORPORATION, Kariya-shi, Aichi (JP)

(72) Inventors: Jun Saito, Toyota (JP); Sachiko Aoi, Nagakute (JP); Yasushi Urakami, Kariya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 0 days.

(21) Appl. No.: 16/075,840

(22) PCT Filed: Dec. 26, 2016

(86) PCT No.: PCT/JP2016/005222
§ 371 (c)(1),
(2) Date: Aug. 6, 2018

(87) PCT Pub. No.: WO2017/145211
PCT Pub. Date: Aug. 31, 2017

(65) Prior Publication Data
US 2019/0058060 A1 Feb. 21, 2019

(30) Foreign Application Priority Data
Feb. 26, 2016 (JP) .................. 2016-035590

(51) Int. Cl.
*H01L 29/78* (2006.01)
*H01L 29/06* (2006.01)
(Continued)

(52) U.S. Cl.
CPC ........ *H01L 29/7813* (2013.01); *H01L 21/047* (2013.01); *H01L 21/26513* (2013.01);
(Continued)

(58) Field of Classification Search
CPC ..... H01L 21/04–0495; H01L 21/26513; H01L 21/26586; H01L 21/42–428; H01L 27/02;
(Continued)

(56) References Cited

U.S. PATENT DOCUMENTS 6,433,385 B1 * 8/2002 Kocon ................ H01L 29/0619
257/328
6,461,918 B1 * 10/2002 Calafut ............... H01L 29/0878
438/270
(Continued)

FOREIGN PATENT DOCUMENTS

| EP | 2 863 417 A1 | 4/2015 |
|---|---|---|
| JP | 2007-242852 A | 9/2007 |
| JP | 2014-207326 A | 10/2014 |

*Primary Examiner* — Maliheh Malek
(74) *Attorney, Agent, or Firm* — Oliff PLC (57) ABSTRACT

A trench gate semiconductor switching element is provided. The semiconductor substrate of the element includes a second conductivity type bottom region in contact with the gate insulation layer at a bottom surface of the trench, and a first conductivity type second semiconductor region extending from a position in contact with a lower surface of the body region to a position in contact with a lower surface of the bottom region. The bottom region includes a first bottom region in contact with the gate insulation layer in a first range of the bottom surface positioned at an end in a long direction of the trench and extending from the bottom surface to a first position; and a second bottom region in contact with the gate insulation layer in a second range adjacent to the first range and extending from the bottom surface to a second position lower than the first position.

7 Claims, 9 Drawing Sheets (51) Int. Cl.
  *H01L 29/36*  (2006.01)
  *H01L 29/08*  (2006.01)
  *H01L 29/16*  (2006.01)
  *H01L 21/04*  (2006.01)
  *H01L 21/265* (2006.01)
  *H01L 29/423* (2006.01)
  *H01L 29/66*  (2006.01)
  *H01L 29/739* (2006.01)
  *H01L 29/10*  (2006.01)
  *H01L 29/417* (2006.01)

(52) U.S. Cl.
  CPC .... *H01L 21/26586* (2013.01); *H01L 29/0623* (2013.01); *H01L 29/0696* (2013.01); *H01L 29/0865* (2013.01); *H01L 29/1095* (2013.01); *H01L 29/16* (2013.01); *H01L 29/1608* (2013.01); *H01L 29/36* (2013.01); *H01L 29/41741* (2013.01); *H01L 29/4236* (2013.01); *H01L 29/42368* (2013.01); *H01L 29/66068* (2013.01); *H01L 29/66734* (2013.01); *H01L 29/7397* (2013.01); *H01L 29/66348* (2013.01)

(58) Field of Classification Search
  CPC . H01L 27/0203; H01L 27/04; H01L 27/0617; H01L 27/0688; H01L 27/0694; H01L 27/07; H01L 27/0705; H01L 27/08; H01L 27/085; H01L 27/088; H01L 27/0883; H01L 27/0886; H01L 27/092; H01L 27/0924–0928; H01L 27/095; H01L 27/098; H01L 27/105; H01L 27/1104; H01L 27/11273; H01L 27/11553; H01L 27/11556; H01L 27/1158; H01L 29/02; H01L 29/0603–0646; H01L 29/0696; H01L 29/0843; H01L 29/0847; H01L 29/0865; H01L 29/0882; H01L 29/1025; H01L 29/1029; H01L 29/1033; H01L 29/1037; H01L 29/1041; H01L 29/1045; H01L 29/105; H01L 29/107–1083; H01L 29/1095; H01L 29/36; H01L 29/41741; H01L 29/1608; H01L 29/42316; H01L 29/42336; H01L 29/42352; H01L 29/42356–42392; H01L 29/66045–66053; H01L 29/66068; H01L 29/66734; H01L 29/7397; H01L 29/7813; H01L 29/06–29/0607

See application file for complete search history.

(56) References Cited

U.S. PATENT DOCUMENTS

| | | | | |
|---|---|---|---|---|
| 6,570,185 | B1 * | 5/2003 | Tan | H01L 29/0619 257/77 |
| 7,265,415 | B2 * | 9/2007 | Shenoy | H01L 29/0623 257/330 |
| 7,598,543 | B2 * | 10/2009 | Hofmann | H01L 27/108 257/208 |
| 8,716,747 | B2 * | 5/2014 | Saito | H01L 27/0664 257/140 |
| 8,878,263 | B2 * | 11/2014 | Manda | H01L 27/14609 257/292 |
| 9,419,118 | B1 * | 8/2016 | Tsukanov | H01L 29/7397 |
| 9,679,989 | B2 * | 6/2017 | Onishi | H01L 29/66348 |
| 9,853,141 | B2 * | 12/2017 | Saito | H01L 29/42368 |
| 9,954,096 | B2 * | 4/2018 | Fujiwara | H01L 29/66068 |
| 10,056,374 | B2 * | 8/2018 | Saito | H01L 27/088 |
| 10,121,862 | B2 * | 11/2018 | Kurokawa | H01L 29/1095 |
| 10,164,021 | B2 * | 12/2018 | Okumura | H01L 29/1608 |
| 10,170,470 | B2 * | 1/2019 | Onishi | H01L 27/088 |
| 2006/0170037 | A1 * | 8/2006 | Yamauchi | H01L 29/0634 257/330 |
| 2007/0045700 | A1 * | 3/2007 | Ohtani | H01L 29/7813 257/301 |
| 2008/0315301 | A1 * | 12/2008 | Takemori | H01L 29/1095 257/331 |
| 2009/0032965 | A1 * | 2/2009 | Urakami | H01L 29/0634 257/774 |
| 2009/0146209 | A1 * | 6/2009 | Akiyama | H01L 29/0634 257/334 |
| 2010/0224932 | A1 | 9/2010 | Takaya et al. | |
| 2011/0233728 | A1 * | 9/2011 | Chiola | H01L 29/0623 257/607 |
| 2012/0313164 | A1 * | 12/2012 | Senoo | H01L 29/1095 257/330 |
| 2013/0001592 | A1 * | 1/2013 | Miyahara | H01L 29/4236 257/77 |
| 2013/0264637 | A1 * | 10/2013 | Katou | H01L 29/7827 257/331 |
| 2013/0306983 | A1 * | 11/2013 | Nakano | H01L 29/0623 257/76 |
| 2014/0008718 | A1 * | 1/2014 | Toyoda | H01L 21/823412 257/330 |
| 2014/0042530 | A1 * | 2/2014 | Cho | H01L 29/0619 257/330 |
| 2014/0042531 | A1 * | 2/2014 | Park | H01L 29/7813 257/330 |
| 2014/0319577 | A1 * | 10/2014 | Sugimoto | H01L 29/7397 257/139 |
| 2015/0069405 | A1 * | 3/2015 | Yoshioka | H01L 29/66462 257/76 |
| 2015/0115286 | A1 * | 4/2015 | Takeuchi | H01L 21/8213 257/77 |
| 2015/0171175 | A1 * | 6/2015 | Takaya | H01L 29/7813 257/330 |
| 2015/0318385 | A1 * | 11/2015 | Kameyama | H01L 29/861 257/140 |
| 2016/0043168 | A1 * | 2/2016 | Ding | H01L 29/0626 257/328 |
| 2016/0133741 | A1 * | 5/2016 | Matsuki | H01L 29/7813 257/77 |
| 2016/0141409 | A1 * | 5/2016 | Takaya | H01L 21/76237 257/330 |
| 2016/0149029 | A1 * | 5/2016 | Takaya | H01L 29/7813 257/330 |
| 2016/0172471 | A1 * | 6/2016 | Hirabayashi | H01L 29/7397 257/124 |
| 2016/0225862 | A1 * | 8/2016 | Hara | H01L 29/404 |
| 2016/0240641 | A1 * | 8/2016 | Okawara | H01L 29/7397 |
| 2016/0247910 | A1 * | 8/2016 | Suzuki | H01L 29/66068 |
| 2016/0359026 | A1 * | 12/2016 | Matsuura | H01L 29/7397 |
| 2017/0012108 | A1 * | 1/2017 | Sakakibara | H01L 21/2033 |
| 2017/0012121 | A1 * | 1/2017 | Saito | H01L 21/047 |
| 2017/0053992 | A1 * | 2/2017 | Okada | H01L 29/4236 |
| 2017/0092742 | A1 * | 3/2017 | Onishi | H01L 29/66348 |
| 2017/0213907 | A1 * | 7/2017 | Soeno | H01L 29/42368 |
| 2017/0221714 | A1 * | 8/2017 | Wakimoto | H01L 29/66068 |
| 2017/0229574 | A1 * | 8/2017 | Kishi | H01L 29/0692 |
| 2017/0288014 | A1 * | 10/2017 | Saito | H01L 29/7397 |
| 2017/0323959 | A1 * | 11/2017 | De-Michielis | H01L 21/2253 |
| 2018/0069115 | A1 * | 3/2018 | Sugai | H01L 29/7811 |
| 2018/0090612 | A1 * | 3/2018 | Fujiwara | H01L 29/66068 |
| 2018/0102361 | A1 * | 4/2018 | Saito | H01L 27/088 |
| 2018/0114789 | A1 * | 4/2018 | Onishi | H01L 27/088 |
| 2018/0114845 | A1 * | 4/2018 | Mimura | H01L 29/78 |
| 2018/0151366 | A1 * | 5/2018 | Endo | H01L 21/265 |
| 2018/0158898 | A1 * | 6/2018 | Okawa | H01L 21/0475 |
| 2018/0175140 | A1 * | 6/2018 | Murakami | H01L 29/0623 |
| 2018/0175149 | A1 * | 6/2018 | Takaya | H01L 29/42368 |
| 2018/0240906 | A1 * | 8/2018 | Tsujimura | H01L 29/42368 |
| 2018/0286974 | A1 * | 10/2018 | Kumazawa | H01L 29/1095 |
| 2018/0342587 | A1 * | 11/2018 | Okumura | H01L 29/1608 |
| 2018/0358454 | A1 * | 12/2018 | Okumura | H01L 29/7395 |
| 2018/0366574 | A1 * | 12/2018 | Ohse | H01L 29/7811 |
| 2019/0035944 | A1 * | 1/2019 | Nagaoka | H01L 29/36 |

(56) References Cited

U.S. PATENT DOCUMENTS

2019/0043999 A1* 2/2019 Nagaoka ............. H01L 29/0661
2019/0067420 A1* 2/2019 Takaya ................ H01L 29/1095
2019/0074372 A1* 3/2019 Kobayashi .......... H01L 29/7813

* cited by examiner

SEMICONDUCTOR SWITCHING ELEMENT

TECHNICAL FIELD

The present disclosure relates to a switching element.

BACKGROUND ART

Patent literature 1 discloses a switching element. This switching element includes a semiconductor substrate having a trench provided on its upper surface. An inner surface of the trench is covered by a gate insulation layer. A gate electrode is arranged within the trench. The gate electrode is insulated from the semiconductor substrate by the gate insulation layer. An n-type source region, a p-type body region, an n-type drift region, and a p-type bottom region (p-diffused region) are provided in the semiconductor substrate. The source region is in contact with the gate insulation layer. The body region is in contact with the gate insulation layer on a lower side of the source region. The bottom region is in contact with the gate insulation layer at a bottom surface of the trench. The drift region extends from a position being in contact with a lower surface of the body region to a position being in contact with a lower surface of the bottom region. The drift region is in contact with the gate insulation layer on a lower side of the body region.

When the switching element of Patent literature 1 turns off, a depletion layer expands from an interface between the body region and the drift region. At this occasion, a depletion layer expands from an interface between the bottom region and the drift region as well. A wide range of the drift region is depleted by these depletion layers.

CITATION LIST

Patent Literature

[Patent Literature 1] Japanese Patent Application Publication No. 2007-242852

SUMMARY OF INVENTION

As mentioned above, when the switching element of Patent literature 1 turns off, the depletion layer expands from the interface between the bottom region and the drift region into the drift region. Further, this depletion layer expands into the bottom region as well. As a result of this, a potential difference is generated in the depleted semiconductor region between the drift region and the bottom region. At this occasion, due to the gate electrode having a substantially same potential over its entirety, equipotential lines are distributed on a lower side under the trench having the gate electrode accommodated therein, as compared to a region where no trench exists. Due to this, the equipotential lines curve around a corner between the bottom surface of the trench and a side surface thereof. As a result, intervals between the equipotential lines become locally narrow around the corner. Due to this, an electric field concentration occurs around the corner.

The electric field concentration around an end (that is, the corner) of the trench in a short direction can be alleviated by providing trenches in parallel. Contrary to this, it was difficult to alleviate the electric field concentration around an end (that is, the corner) of the trench in a long direction. Thus, the disclosure herein provides a technique to improve voltage resistance of a switching element by suppressing an electric field concentration around an end of a trench in a long direction.

The switching element disclosed herein comprises a semiconductor substrate on an upper surface of which a trench is provided; a gate insulation layer covering an inner surface of the trench; and a gate electrode arranged in the trench and insulated from the semiconductor substrate by the gate insulation layer. The semiconductor substrate comprises a first conductivity type first semiconductor region being in contact with the gate insulation layer; a second conductivity type body region being in contact with the gate insulation layer on a lower side of the first semiconductor region; a second conductivity type bottom region being in contact with the gate insulation layer at a bottom surface of the trench; and a first conductivity type second semiconductor region extending from a position being in contact with a lower surface of the body region to a position being in contact with a lower surface of the bottom region, being in contact with the gate insulation layer on a lower side of the body region, and separated from the first semiconductor region by the body region. The bottom region comprises a first bottom region being in contact with the gate insulation layer in a first range of the bottom surface that is positioned at an end in a long direction of the trench, and extending from the bottom surface to a first position lower than the bottom surface; and a second bottom region being in contact with the gate insulation layer in a second range of the bottom surface that is adjacent to the first range, and extending from the bottom surface to a second position lower than the first position.

Notably, one of the first conductivity type and the second conductivity type is an n-type, and the other thereof is a p-type.

When this switching element turns off, a depletion layer expands from an interface between the body region and the second semiconductor region. Further, a depletion layer expands from an interface between the bottom region and the second semiconductor region (that is, from the lower surface of the bottom region) as well. The second semiconductor region is depleted by these depletion layers. Further, the depletion layer expanding from the interface between the bottom region and the second semiconductor region expands into the bottom region as well. The second bottom region extends to a lower side than the first bottom region (that is, a lower surface of the second bottom region is located on the lower side than a lower surface of the first bottom region). Due to this, an upper end of the depletion layer in the second bottom region comes to be located on the lower side than an upper end of the depletion layer in the first bottom region. Since the electric field is generated in a depleted region, in a depleted range within the second bottom region, equipotential lines are distributed on the lower side than in a depleted range within the first bottom region. Due to this, in the depleted range within the first bottom region, the equipotential lines are distributed in a state where they gradually shift upward from the second bottom region toward the end of the trench in the long direction. As a result, the curve in the equipotential lines around the corner between an end surface (side surface) of the trench in the long direction and the bottom surface of the trench is alleviated. Due to this, intervals between the equipotential lines are suppressed from becoming narrow around the corner, and an electric field concentration around the corner is suppressed. Due to this, this switching element exhibits a high voltage resistance.

DESCRIPTION OF EMBODIMENTS

First Embodiment

Figure 1:
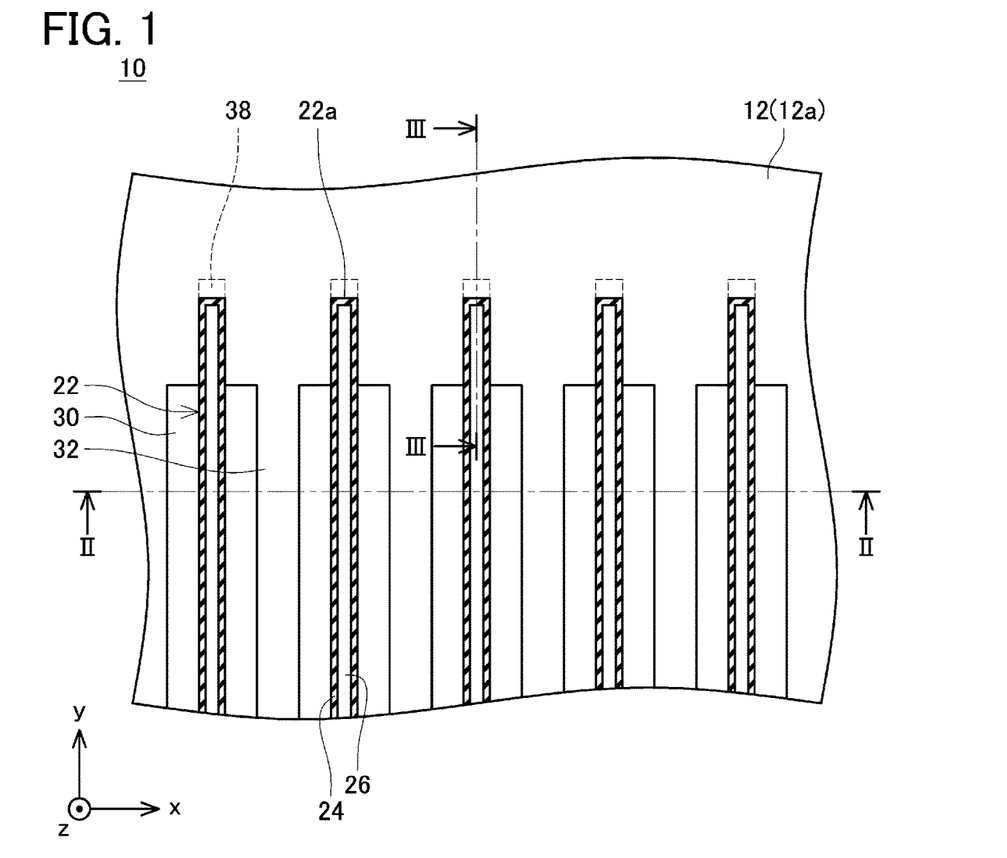
FIG. 1 is a plan view of a MOSFET 10 of a first embodiment.
Figure 2:
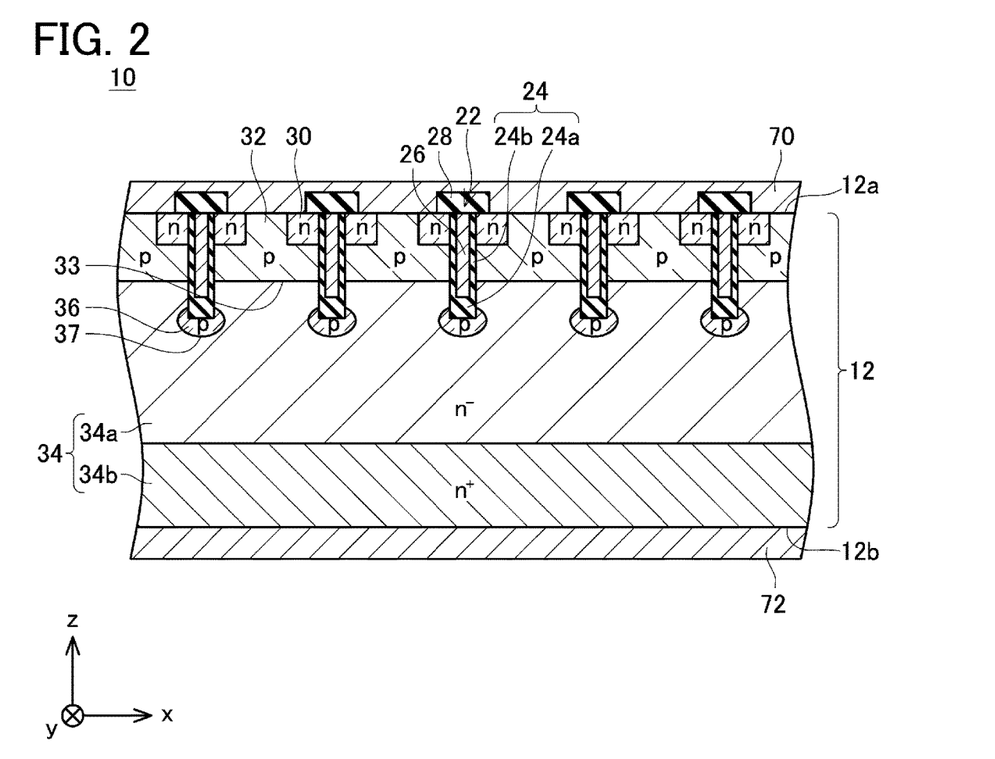
FIG. 2 is a vertical cross sectional view of the MOSFET 10 along a line II-II in FIG. 1.
Figure 3:
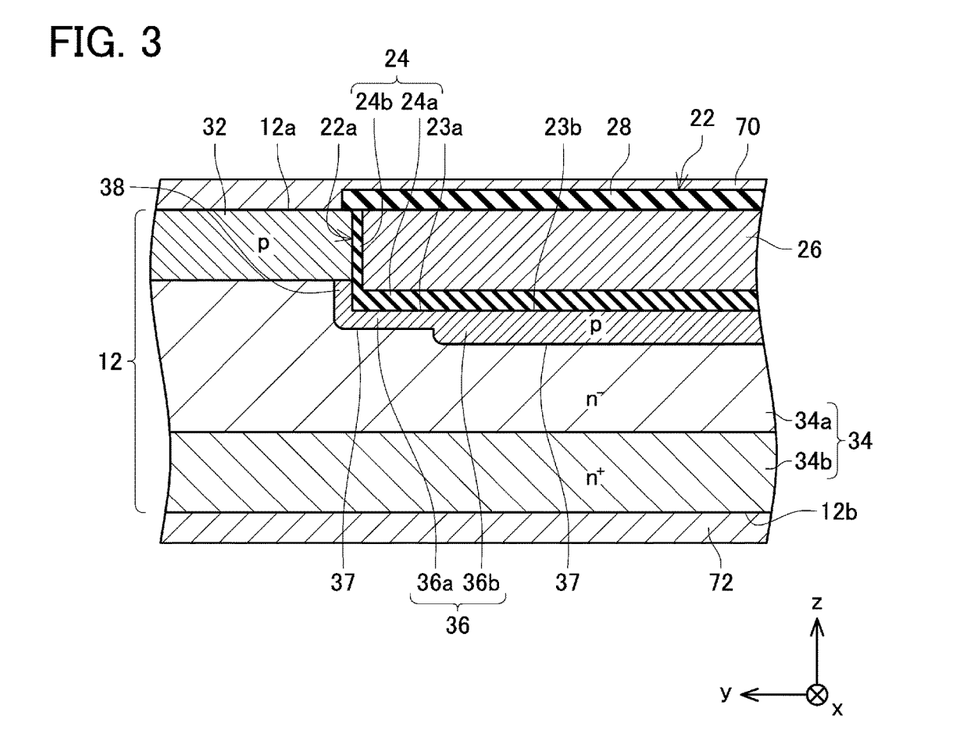
FIG. 3 is a vertical cross sectional view of the MOSFET 10 along a line III-III in FIG. 1.

FIGS. 1 to 3 show a MOSFET (Metal-Oxide-Semiconductor Field-Effect Transistor) 10 of a first embodiment. As shown in FIGS. 2 and 3, the MOSFET 10 comprises a semiconductor substrate 12, electrodes, insulation layers, and the like. Notably, for a clearer view, FIG. 1 omits depiction of an electrode and insulation layers on an upper surface 12a of the semiconductor substrate 12. Hereinbelow, a direction parallel to the upper surface 12a of the semiconductor substrate 12 will be termed an x direction, a direction parallel to the upper surface 12a of the semiconductor substrate 12 and orthogonally crossing the x direction will be termed a y direction, and a thickness direction of the semiconductor substrate 12 will be termed a z direction. The semiconductor substrate 12 is constituted of SiC (silicon carbide).

As shown in FIG. 2, the upper surface 12a of the semiconductor substrate 12 is provided with a plurality of trenches 22. As shown in FIG. 1, each of the trenches 22 extends linearly along the y direction. The plurality of trenches 22 is arranged with intervals in the x direction. As shown in FIG. 2, an inner surface of each of the trenches 22 is covered by a gate insulation layer 24. Each gate insulation layer 24 comprises a bottom insulation layer 24a and a side insulation layer 24b. Each bottom insulation layer 24a covers a bottom surface of its corresponding trench 22. Each side insulation layer 24b covers a side surface of its corresponding trench 22. A thickness of the bottom insulation layers 24a is thicker than a thickness of the side insulation layers 24b. A gate electrode 26 is arranged within each of the trenches 22. Each gate electrode 26 is insulated from the semiconductor substrate 12 by its corresponding gate insulation layer 24. An upper surface of each of the gate electrodes 26 is covered by an interlayer insulation film 28.

An upper electrode 70 is arranged on the upper surface 12a of the semiconductor substrate 12. The upper electrode 70 is in contact with the upper surface 12a of the semiconductor substrate 12 at portions where the interlayer insulation films 28 are not provided. The upper electrode 70 is insulated from the gate electrodes 26 by the interlayer insulation films 28. A lower electrode 72 is arranged on a lower surface 12b of the semiconductor substrate 12. The lower electrode 72 is in contact with the lower surface 12b of the semiconductor substrate 12.

As shown in FIGS. 1 to 3, a plurality of source regions 30, a body region 32, a drain region 34, a plurality of bottom regions 36, and a plurality of end regions 38 are provided in the semiconductor substrate 12.

Each of the source regions 30 is an n-type region. As shown in FIG. 2, each of the source regions 30 is arranged at a position exposed at the upper surface 12a of the semiconductor substrate 12, and is in ohmic contact with the upper electrode 70. Further, each of the source regions 30 is in contact with its corresponding side insulation layer 24b at an upper end portion of its trench 22.

The body region 32 is a p-type region. As shown in FIG. 2, the body region 32 is in contact with each of the source regions 30. The body region 32 extends from a range intervened between adjacent source regions 30 to a lower side than the respective source regions. In the range intervened between the adjacent source regions 30, a p-type impurity concentration in the body region 32 is high. The body region 32 is in ohmic contact with the upper electrode 70 in the range intervened between the adjacent source regions 30. The p-type impurity concentration in the body region 32 is low on the lower side than the source regions 30. The body region 32 is in contact with the side insulation layers 24b on the lower side than the source regions 30. A lower surface of the body region 32 is located above lower ends of the gate electrodes 26. Further, as shown in FIGS. 1 and 3, the body region 32 is provided also in a range adjacent to the trenches 22 in the y direction.

Each of the bottom regions 36 is a p-type region. As shown in FIGS. 2 and 3, each of the bottom regions 36 is arranged in a range exposed at the bottom surface of the corresponding trench 22. Each of the bottom regions 36 is in contact with the corresponding bottom insulation layer 24a at the bottom surface of its trench 22. As shown in FIG. 3, each of the bottom regions 36 extends along the bottom surface of its corresponding trench 22 in the y direction. Each of the bottom regions 36 is in contact with its corresponding bottom insulation layer 24a over an entirety of the bottom surface of its trench 22. Each of the bottom regions 36 comprises a first bottom region 36a and a second bottom region 36b. A thickness of the second bottom regions 36b is thicker than a thickness of the first bottom regions 36a. That is, each of the first bottom regions 36a extends from the bottom surface of the corresponding trench 22 downward to a first position (position of a lower surface of the first bottom region 36a), and each of the second bottom regions 36b extends from the bottom surface of the corresponding trench 22 to a second position (position of a lower surface of the second bottom region 36b) located lower than the first position. As shown in FIG. 3, in a cross section along the long direction of the trenches 22, the lower surface of each first bottom region 36a extends linearly parallel to the y direction, and the lower surface of each second bottom region 36b extends linearly parallel to the y direction. The lower surface of each second bottom region 36b is located lower than the lower surface of each first bottom region 36a. That is, a position of the lower surface of each bottom region 36 shifts downward in a step-like shape from its first bottom region 36a toward its second bottom region 36b. A p-type impurity concentration of the first bottom regions 36a is substantially equal to a p-type impurity concentration of the second bottom regions 36b.

Each first bottom region 36a is arranged at a lower portion of an end 22a of the corresponding trench 22 in the long direction (that is, the y direction). That is, each first bottom region 36a is in contact with its corresponding bottom insulation layer 24a in a first range 23a located at each end 22a of the bottom surface of its trench 22. Notably, although not shown, the first bottom region 36a is also provided at the bottom surface located at an opposite end from the end 22a shown in FIG. 3. An effective carrier density of the bottom regions 36 is calculated by a difference between the p-type impurity concentration of the bottom regions 36 and an n-type impurity concentration of the bottom regions 36. Further, a value obtained by integrating the effective carrier density of the bottom regions 36 under the trenches 22 (immediately below the trenches 22) in the z direction will hereinbelow be termed an effective carrier surface density. The effective carrier surface density of the first bottom regions 36a is smaller than $1.4 \times 10^{13}$ (cm$^{-2}$). A width of the first bottom regions 36a in the y direction is larger than a thickness of the first bottom regions 36a in the z direction.

Each second bottom region 36b is arranged at a position adjacent to its corresponding first bottom regions 36a in the long direction of the trenches 22 (that is, the y direction). That is, the second bottom region 36b is in contact with the bottom insulation layer 24a in each second range 23b adjacent to the corresponding first ranges 23a within the bottom surface of each trench 22. Accordingly, the second bottom region 36b is arranged at a position farther away from the ends 22a of its corresponding trench 22 than the first bottom regions 36a. The second bottom region 36b is in contact with an entire bottom surface of the corresponding trench 22 excluding vicinities of the ends 22a thereof. Since the thickness of the second bottom regions 36b is thicker than that of the first bottom regions 36a, an effective carrier surface density of the second bottom regions 36b is greater than an effective carrier surface density of the first bottom regions 36a. The effective carrier surface density of the second bottom regions 36b is greater than $1.4 \times 10^{13}$ (cm$^{-2}$). A width of the second bottom regions 36b in the y direction is larger than the width of the first bottom regions 36a in the y direction.

The drain region 34 is an n-type region. As shown in FIGS. 2 and 3, the drain region 34 is arranged under the body region 32. The drain region 34 comprises a drift region 34a having a low n-type impurity concentration and a drain contact region 34b having a higher n-type impurity concentration than the drift region 34a. The drift region 34a is arranged under the body region 32. The drift region 34a is separated from the source regions 30 by the body region 32. The drift region 34a extends from a position being contact with the lower surface of the body region 32 to a lower side than the respective bottom regions 36. The drift region 34a is in contact with a lower surface and a side surface of each bottom region 36 (that is, the first bottom region 36a and the second bottom region 36b). As shown in FIG. 2, the drift region 34a is in contact with the side insulation layers 24b under the body region 32. The drain contact region 34b is arranged under the drift region 34a. The drain contact region 34b is exposed at the lower surface 12b of the semiconductor substrate 12. The drain contact region 34b is in ohmic contact with the lower electrode 72.

As shown in FIGS. 1 and 3, each of the end regions 38 is provided along each end 22a of the corresponding trench 22 in the long direction. Each of the end regions 38 is a p-type region. As shown in FIG. 3, a lower end of each end region 38 is connected to the corresponding first bottom region 36a. An upper end of each end region 38 is connected to the body region 32. As aforementioned, the body region 32 is connected to the upper electrode 70. Due to this, the respective first bottom regions 36a are connected to the upper electrode 70 via the end regions 38 and the body region 32.

Next, an operation of the MOSFET 10 will be described. When the MOSFET 10 is used, the MOSFET 10, a load (for example, a motor), and a power source are connected in serial. A power voltage is applied to this serial circuit of the MOSFET 10 and the load. The power voltage is applied along a direction with which a drain side (lower electrode 72 side) has a higher potential than a source side (upper electrode 70 side) in the MOSFET 10. A gate potential of the MOSFET 10 (potential of the gate electrodes 26) is controlled by a controller that is not shown.

A state when the MOSFET 10 is off will be described. The MOSFET 10 is off when the gate potential is lower than a threshold. In this state, the potential of the lower electrode 72 is higher than the potential of the upper electrode 70. Since the body region 32 is connected to the upper electrode 70 and the drift region 34a is connected to the lower electrode 72 via the drain contact region 34b, a reverse voltage is applied to a pn junction 33 at an interface between the body region 32 and the drift region 34a. Thus, a depletion layer extends from the pn junction 33. Further, the bottom regions 36 are connected to the upper electrode 70 via the end regions 38 and the body region 32. Due to this, a reverse voltage is applied also to pn junctions 37 at interfaces between the bottom regions 36 and the drift region 34a. Accordingly, depletion layers extend from the pn junctions 37 as well. Since the n-type impurity concentration of the drift region 34a is low, a depletion layer expands widely within the drift region 34a. Due to this, substantially an entirety of the drift region 34a is depleted. Further, the depletion layer expands from the pn junction 33 into the body region 32 as well. Further, the depletion layer expands from the pn junctions 37 into the bottom regions 36.

Figure 4:
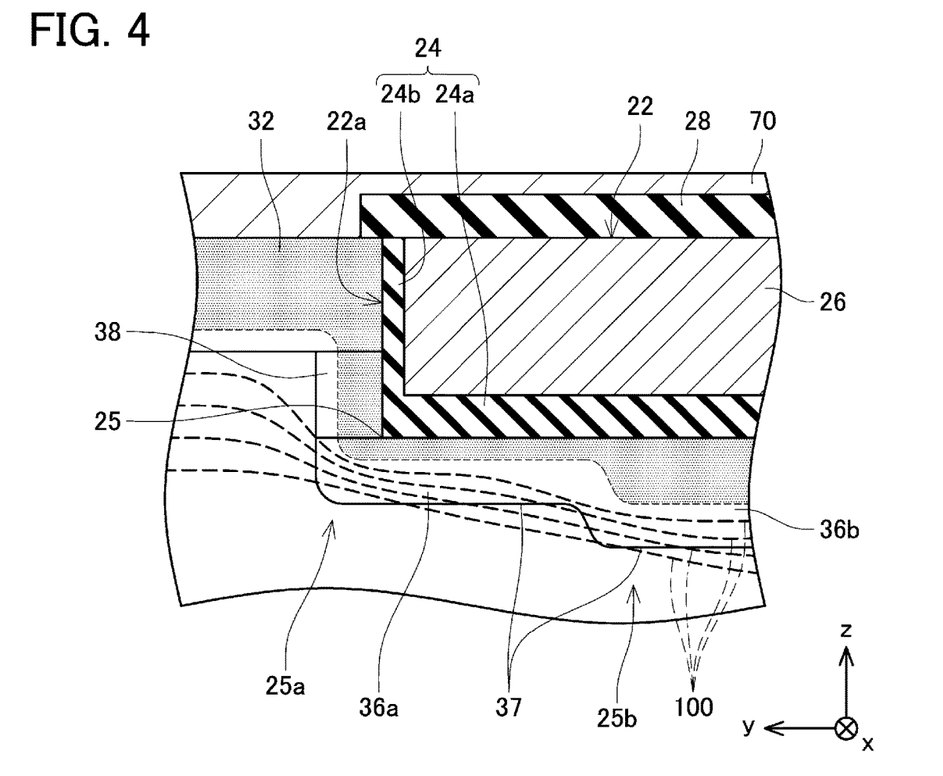
FIG. 4 is an enlarged cross sectional view of a bottom region 36.
Figure 5:
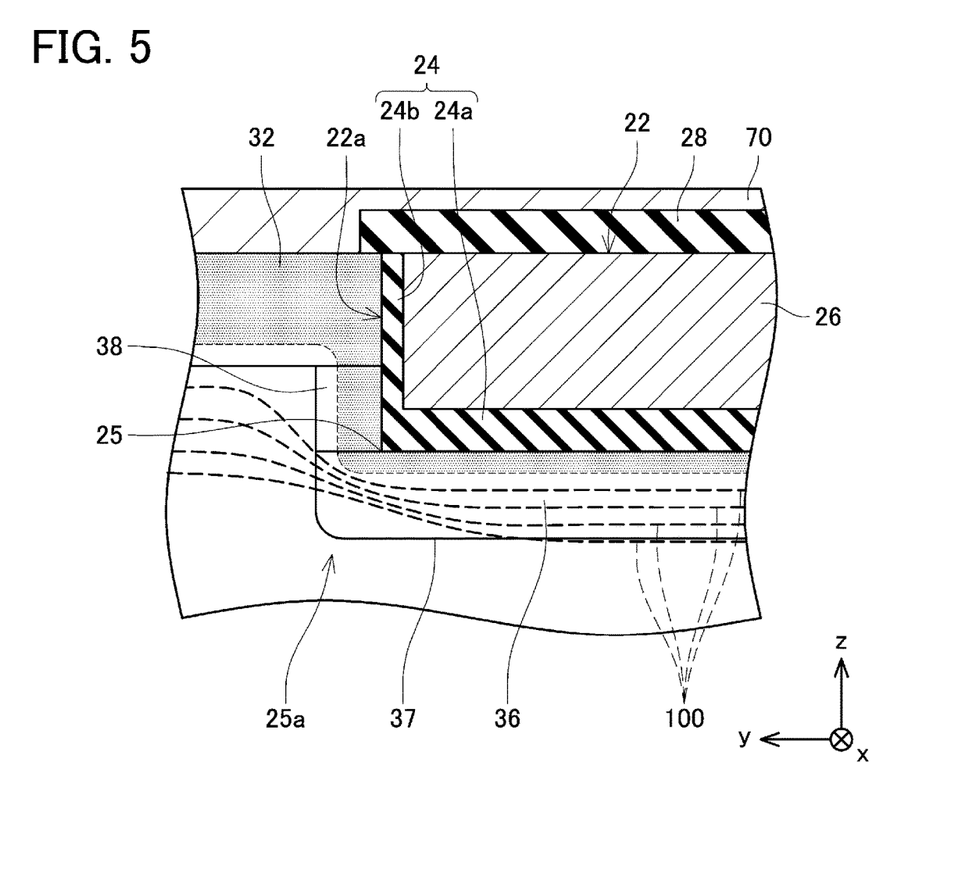
FIG. 5 is an enlarged cross sectional view of a MOSFET of a comparative example corresponding to FIG. 4.

FIG. 4 shows an enlarged view of the first bottom region 36a and the second bottom region 36b shown in FIG. 3. Further, FIG. 5 shows an enlarged cross sectional view corresponding to FIG. 4 of a MOSFET in a comparative example. In the MOSFET of the comparative example shown in FIG. 5, entireties of the bottom regions 36 have a substantially same depth as that of the first bottom regions 36a. That is, in the MOSFET of the comparative example, the entirety of the bottom region 36 has a constant thickness. Other configurations of the MOSFET of the comparative example are similar to those of the MOSFET 10 of the first embodiment. In each of FIGS. 4 and 5, a semiconductor region hatched by dots is a semiconductor region that is not depleted (which is hereinbelow referred to as non-depleted region). In each of FIGS. 4 and 5, a semiconductor region that is not hatched by the dots is a depleted semiconductor region. Since no current flows in the depleted semiconductor region, a potential difference is generated in the depleted semiconductor region. In each of FIGS. 4 and 5, a potential distribution in the depleted semiconductor region is shown by equipotential lines 100.

As shown in FIGS. 4 and 5 by the equipotential lines 100, the equipotential lines 100 extend primarily in a lateral direction (the y direction) under the trench 22. In a region adjacent to the trenches 22 in the long direction (the y direction) of the trenches 22, the equipotential lines are distributed on an upper side than under the trenches 22. Accordingly, the equipotential lines 100 are bent obliquely upward from under the trenches 22 in vicinities of corners 25 between end surfaces of the trenches 22 (side surfaces defining the ends 22a of the trenches 22) and the bottom surfaces of the trenches 22. Due to this, in FIGS. 4 and 5, intervals between the equipotential lines 100 become locally narrow in a range 25*a* in a vicinity of each corner 25. Thus, in the range 25*a*, an electric field is high compared to its surroundings. However, the electric field in the range 25*a* is alleviated more in FIG. 4 than in FIG. 5. Hereinbelow, this point will be described in detail.

In the MOSFET of the comparative example, the thickness of the entireties of the bottom regions 36 is constant, and hence the position of the lower surfaces of the bottom regions 36 (the pn junctions 37) is constant. Thus, as shown in FIG. 5, an upper end of the depletion layer extending from the pn junction 37 into the bottom region 36 is distributed at a constant depth. In other words, a lower end of the non-depleted region in the bottom region 36 is distributed at a constant depth. Due to this, the equipotential lines 100 extend in the lateral direction at a substantially constant depth under the non-depleted region of the bottom region 36. The equipotential lines 100 abruptly curve at the range 25*a* in the vicinity of the corner 25. Due to this, in this range 25*a*, the intervals of the equipotential lines 100 are extremely narrow. That is, in the MOSFET of the comparative example, an extremely high electric field is generated in the range 25*a*.

On the other hand, in the MOSFET 10 of the first embodiment, as mentioned above, the lower surfaces (the pn junctions 37) of the first bottom regions 36*a* are located higher than the lower surfaces (the pn junctions 37) of the second bottom regions 36*b*. Accordingly, as shown in FIG. 4, the upper end of the depletion layer expanding into the first bottom region 36*a* from the pn junction 37 is located higher than the upper end of the depletion layer expanding into the second bottom region 36*b* from the pn junction 37. In other words, a lower end of the non-depleted region in the second bottom region 36*b* protrudes further downward than a lower end of the non-depleted region in the first bottom region 36*a*. Due to this, the equipotential lines 100 are pressed more downward below the non-depleted region in the second bottom region 36*b* than below the non-depleted region in the first bottom region 36*a*. As a result, the equipotential lines 100 are distributed below the non-depleted region in each first bottom region 36*a* such that the equipotential lines 100 gradually shift upward from a second bottom region 36*b* side toward the corresponding corner 25. Due to this, a curving degree of the equipotential lines 100 in the range 25 in the vicinity of each corner 25 is moderated as compared to that of FIG. 5. Due to this, the intervals between the equipotential lines 100 in the range 25*a* are wide as compared to those of FIG. 5. That is, with the MOSFET 10 of the first embodiment, the electric field in the range 25*a* is alleviated as compared to the MOSFET of the comparative example.

As above, in the MOSFET 10 of the first embodiment, the curving degree of the equipotential lines 100 in the vicinity of each corner 25 can be moderated due to the equipotential lines 100 being distributed so as to gradually shift upward from the second bottom region 36*b* side toward the corresponding corner 25 under the non-depleted region in each first bottom region 36*a*. Due to this, the intervals of the equipotential lines 100 becoming narrow in the vicinity of each corner 25 can be suppressed, as a result of which an electric field concentration in the vicinity of each corner 25 can be suppressed. Especially, since each of the corners 25 is close to the corresponding side insulation layer 24*b* having a thin thickness, the suppression of the electric field concentration in the vicinity of each corner 25 allows an electric field applied to the corresponding side insulation layer 24*b* to be alleviated. Due to this, deterioration in an insulation property of the side insulation layers 24*b* can be suppressed. Thus, the MOSFET 10 of the first embodiment has a high voltage resistance.

Further, as shown in FIG. 4, in the MOSFET 10 of the first embodiment, the electric field is alleviated in the ranges 25*a* in the vicinities of the corners 25, while on the other hand the electric field becomes somewhat stronger under the trenches 22 (ranges 25*b* around interfaces between the first bottom regions 36*a* and the second bottom regions 36*b*) as compared to the MOSFET of the comparative example. However, the bottom surfaces of the trenches 22 are covered by the thick bottom insulation layers 24*a*. The insulation property of the thick bottom insulation layers 24*a* is less likely to deteriorate. Due to this, even if the electric field applied to the bottom insulation layers 24*a* becomes higher, a problem related to the insulation property deterioration does not occur. Accordingly, allowing an increase in the electric field in the ranges 25*b* under the trenches 22 (that is, in vicinities of the thick bottom insulation layers 24*a*) can decrease the electric field in the ranges 25*a* in the vicinities of the corners 25 (that is, in vicinities of the thin side insulation layers 24*b*), as a result of which the voltage resistance of an entire MOSFET 10 is improved.

Next, a case of turning the MOSFET on will be described. When the gate potential is brought up to a potential higher than the threshold, the body region 32 inverts to an n-type in ranges adjacent to the side insulation layers 24*b*, and channels are generated in such ranges. Then, the depletion layer shrinks toward a body region 32 side from the drift region 34*a*, and electrons come to flow through the drift region 34*a*. That is, the MOSFET turns on. Thus, the electrons flow from the upper electrode 70 toward the lower electrode 72 through the source regions 30, the channels, and the drain region 34. That is, a current flows from the lower electrode 72 to the upper electrode 70.

Further, when the MOSFET turns on, a potential of the lower electrode 72 drops to a substantially same potential as that of the upper electrode 70. Then, a potential of the bottom regions 36 drops by capacitive coupling between the lower electrode 72 and the bottom regions 36. In this state, the potential of the bottom regions 36 is lower than a potential of the drift region 34*a*, thus the depletion layer is expanding from the bottom regions 36 to the drift region 34*a*. However, when the potential of the bottom regions 36 drops, charges flow from the upper electrode 70 into the bottom regions 36 through the body region 32 and the end regions 38. With such charges flowing into the bottom regions 36 as aforementioned, the potential of the bottom regions 36 rises to a substantially same potential as that of the upper electrode 70. The increase in the potential of the bottom regions 36 causes the depletion layer, expanding from the bottom regions 36 to the drift region 34*a*, to shrink toward a bottom region 36 side. As a result, a resistance of the drift region 34*a* drops, and an on-resistance of the MOSFET drops. In the MOSFET of the comparative example shown in FIG. 5, a resistance of the entireties of the bottom regions 36 is high due to the thickness of the entireties of the bottom regions 36 being thin. Due to this, when the MOSFET of the comparative example turns on, longer time is required for the charges to scatter thoroughly over the entirety of each bottom region 36. Due to this, in the MOSFET of the comparative example, longer time is required for the depletion layer expanding from the bottom regions 36 to the drift region 34*a* to shrink toward the bottom region 36 side. Accordingly, the MOSFET of the comparative example takes time from when the channels are generated until when the on-resistance drops. On the other hand, in the MOSFET 10 of the first embodiment, although a part of each bottom region 36 is the thin first bottom region 36a, another part thereof is the thick second bottom region 36b. The thickness of the second bottom regions 36b is thick, and hence a resistance of the second bottom regions 36b is low. Thus, when the MOSFET 10 turns on, the charges scatter thoroughly over the entireties of the bottom regions 36 within a short period of time. Due to this, in the MOSFET 10 of the first embodiment, the depletion layer expanding from the bottom regions 36 to the drift region 34a shrinks toward the bottom region 36 side within a short period of time. Thus, in the MOSFET 10 of the first embodiment, the on-resistance drops within a short period of time since when the channels are generated. Due to this, the MOSFET 10 of the first embodiment can be operated with less loss as compared to the MOSFET of the comparative example.

Notably, in SiC, when the effective carrier surface density of a semiconductor region is greater than $1.4 \times 10^{13}$ cm$^{-2}$, not an entirety of a semiconductor region can be depleted no matter how high an application voltage for the semiconductor region is set. On the other hand, in a case where the effective carrier surface density of a semiconductor region is less than $1.4 \times 10^{13}$ cm$^{-2}$, the entire semiconductor region can be depleted by setting the application voltage for the semiconductor region high. In the aforementioned first embodiment, the effective carrier surface density of the second bottom regions 36b is greater than $1.4 \times 10^{13}$ cm$^{-2}$. Due to this, even if the voltage applied between the upper electrode 70 and the lower electrode 72 during when the MOSFET 10 is off is large, the second bottom regions 36b under the trenches 22 are never completely depleted in the thickness direction (z direction). That is, even if the voltage applied between the upper electrode 70 and the lower electrode 72 is large, the non-depleted regions remain in the second bottom regions 36b under the trenches 22. Due to this, the charges are more easily supplied to the entireties of the bottom regions 36 when the MOSFET 10 turns on. Accordingly, in the MOSFET 10 of the first embodiment, the on-resistance drops within a short period of time when the MOSFET 10 turns on, even if the voltage applied between the upper electrode 70 and the lower electrode 72 during when the MOSFET 10 is off is large.

Figure 6:
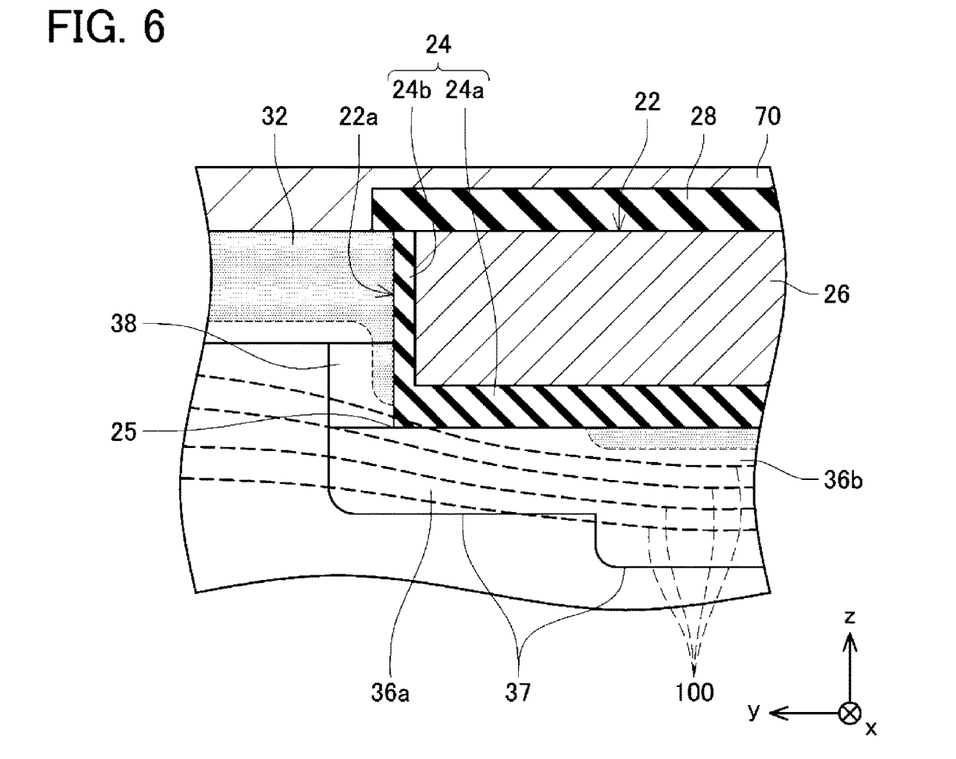
FIG. 6 is an enlarged cross sectional view corresponding to FIG. 4 showing a case where an applied voltage to the MOSFET 10 of the first embodiment is large.

Further, in the aforementioned first embodiment, the effective carrier surface density in the first bottom regions 36a is smaller than $1.4 \times 10^{13}$ cm$^{-2}$. Due to this, when the application voltage between the upper electrode 70 and the lower electrode 72 is further increased from the state of FIG. 4, the first bottom regions 36a are completely depleted in the thickness direction (z direction). As above, when the first bottom regions 36a are depleted completely in the thickness direction, as shown in FIG. 6, the depletion layer reaches the bottom insulation layers 24a in the first bottom regions 36a. When this happens, as shown in FIG. 6, the equipotential lines 100 extend from the depleted first bottom regions 36a over the bottom insulation layers 24a, so the curving degree of the equipotential lines 100 is further moderated than in FIG. 4. Due to this, the electric field concentration in the vicinities of the corners 25 can further be alleviated.

Notably, in the aforementioned first embodiment, a third bottom region may be provided between each pair of the first bottom region 36a and the second bottom region 36b. The third bottom region is a p-type semiconductor region a thickness of which is thicker than that of the first bottom regions 36a, but thinner than that of the second bottom regions 36b. According to this configuration, the electric field can further be alleviated.

Second Embodiment

Figure 7:
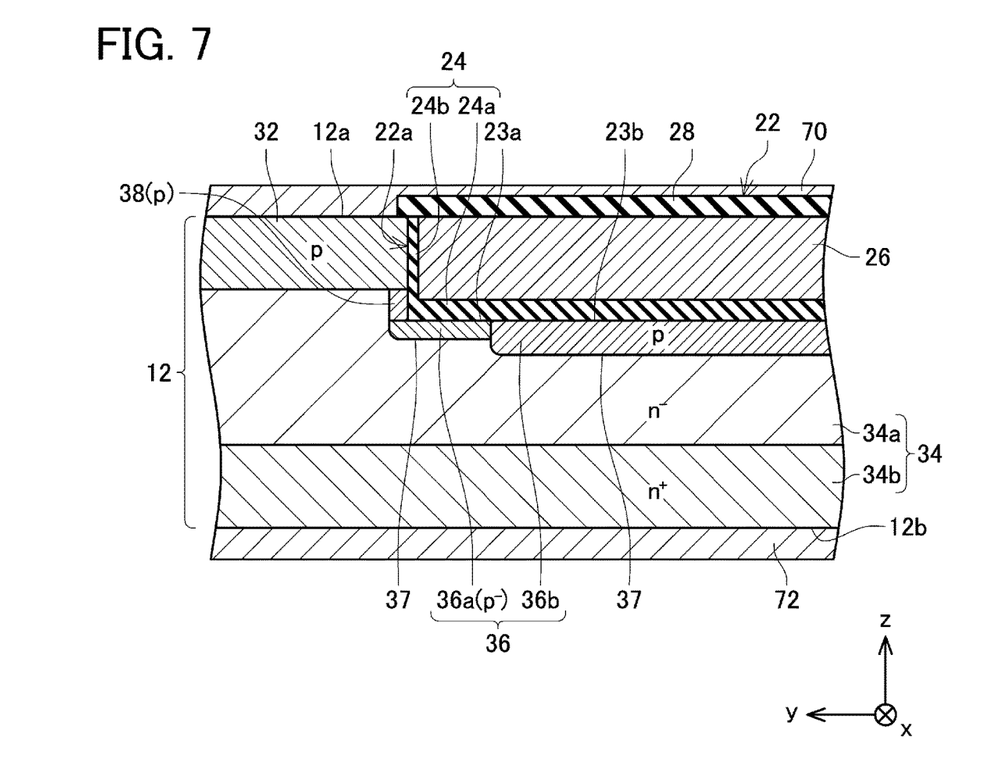
FIG. 7 is a vertical cross sectional view of a MOSFET of a second embodiment corresponding to FIG. 3.
Figure 8:
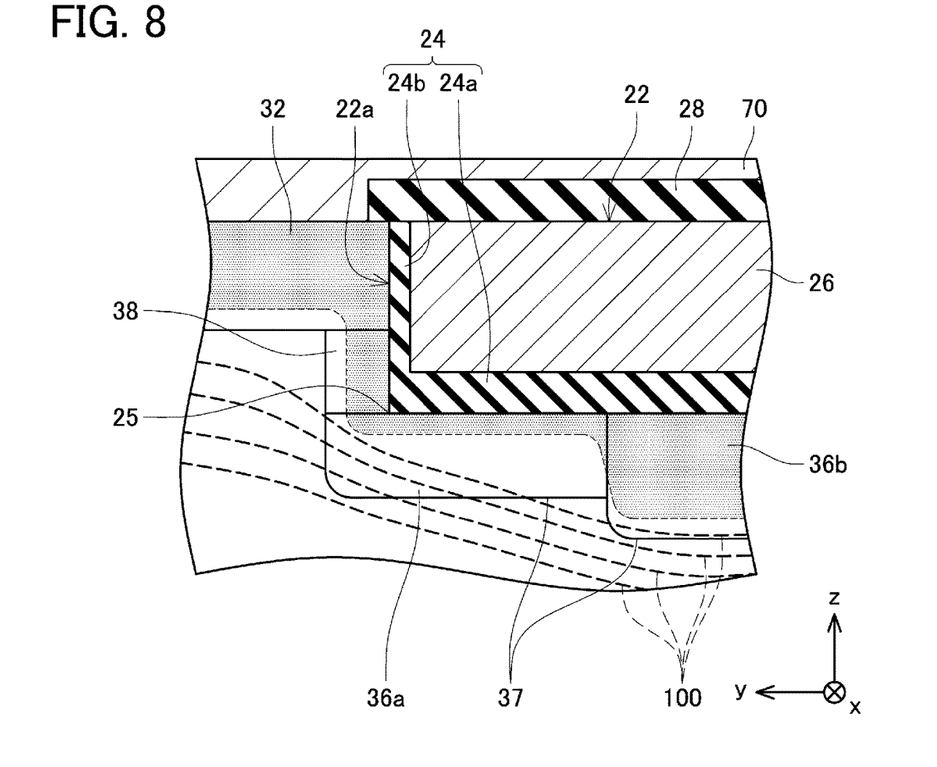
FIG. 8 is an enlarged cross sectional view of the MOSFET of the second embodiment corresponding to FIG. 4.

FIGS. 7 and 8 each show a MOSFET of a second embodiment. In the MOSFET of the second embodiment, the p-type impurity concentration of the second bottom regions 36b is higher than the p-type impurity concentration of the first bottom regions 36a. Other configurations of the MOSFET of the second embodiment are similar to those of the MOSFET 10 of the first embodiment.

As described above, in the MOSFET of the second embodiment, the p-type impurity concentration of the second bottom regions 36b is higher than the p-type impurity concentration of the first bottom regions 36a. Due to this, it is more difficult for the depletion layer to extend in the second bottom regions 36b than in the first bottom regions 36a. Due to this, as shown in FIG. 8, when the MOSFET of the second embodiment turns off, a width of the depletion layer extending into the second bottom regions 36b from the pn junctions 37 is smaller than a width of the depletion layer extending into the first bottom regions 36a from the pn junctions 37. Thus, in FIG. 8, an amount by which the lower ends of the non-depleted regions in the second bottom regions 36b protrude downward relative to the lower ends of the non-depleted regions in the first bottom regions 36a is larger than in the case of the first embodiment (FIG. 4). Due to this, in FIG. 8, a slope angle of the equipotential lines 100 under the non-depleted regions of the first bottom regions 36a is large as compared to that of FIG. 4. Thus, in FIG. 8, the curving degree of the equipotential lines 100 in the vicinity of each corner 25 can further be moderated as compared to that of FIG. 4. Due to this, in FIG. 8, the intervals between the equipotential lines 100 in the vicinity of each corner 25 are wider as compared to those of FIG. 4. Thus according to the MOSFET of the second embodiment, the electric field concentration in the vicinity of each corner 25 can further be alleviated.

Notably, in the aforementioned second embodiment, the above-mentioned third bottom region (that is, a p-type semiconductor region a thickness of which is thicker than that of the first bottom regions 36a but thinner than that of the second bottom regions 36b) may be provided between each pair of the first bottom region 36a and the second bottom region 36b. In this case, a p-type impurity concentration of the third bottom regions may be higher than that of the first bottom regions 36a but lower than that of the second bottom regions 36b. According to this configuration, the electric field can further be alleviated.

Figure 9:
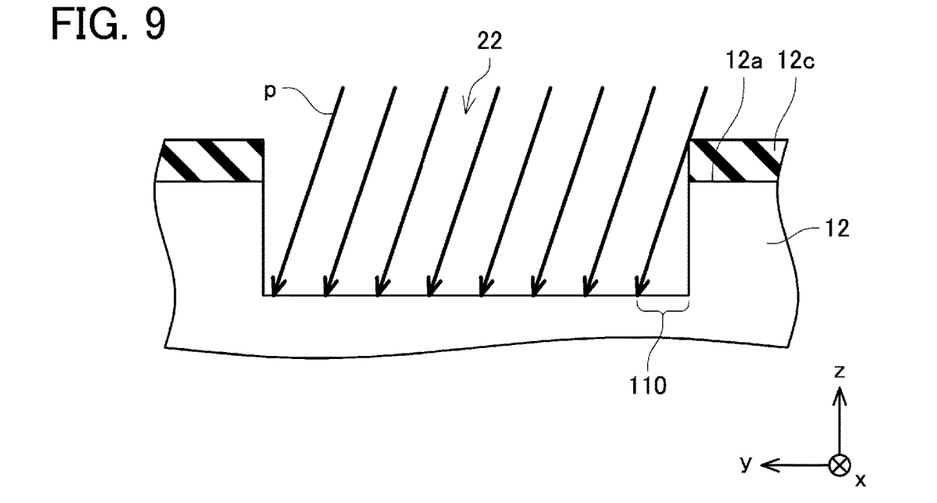
FIG. 9 is an explanatory diagram of a method of forming the bottom region 36 of the second embodiment.
Figure 10:
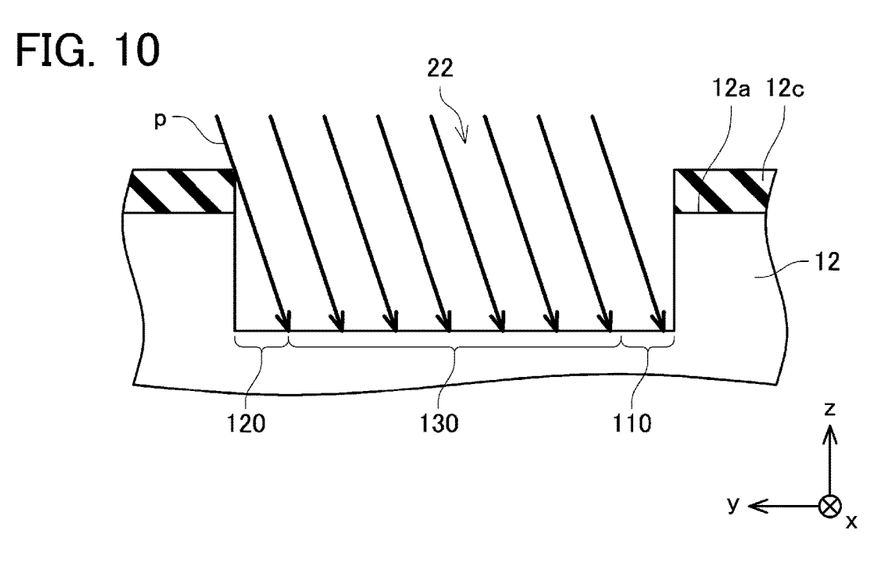
FIG. 10 is an explanatory diagram of the method of forming the bottom region 36 of the second embodiment.

Next, a method of forming the first bottom regions 36a and the second bottom regions 36b of the second embodiment will be described. Firstly, as shown in FIG. 9, the trenches 22 are formed in the upper surface 12a of the semiconductor substrate 12. Then, a mask 12c covering the upper surface 12a of the semiconductor substrate 12 is formed. Then, as shown in FIG. 9, p-type impurities are implanted to the bottom surfaces of the trenches 22 in a state where an ion implanting direction is tilted about an x axis relative to the upper surface 12a of the semiconductor substrate (first implantation). In the first implantation, an ion implantation to a range 110 in a vicinity of one end of each bottom surface of the trench 22 in the long direction (y direction) is interrupted by the upper surface 12a. Next, as shown in FIG. 10, the p-type impurities are implanted to the bottom surfaces of the trenches 22 in a state where the ion implanting direction is tilted about the x axis relative to the upper surface 12a of the semiconductor substrate 12 to an opposite side from that of the first implantation (second implantation). In the second implantation, the ion implantation to a range 120 in a vicinity of the other end of each bottom surface of the trench 22 in the long direction (y direction) is interrupted by the upper surface 12a. The p-type impurities are implanted to a range 130 intervening between the ranges 110 and 120 (center portion of the bottom surface of each trench 22) in both of the first and second implantations. Due to this, an ion implantation amount to the ranges 110, 120 is less than an ion implantation amount to the range 130. Thereafter, the implanted p-type impurities are activated by annealing the semiconductor substrate 12. Further, by the annealing, the p-type impurities diffuse in the semiconductor substrate 12. In the range 130 into which the p-type impurities were implanted at a high concentration, a diffusion distance of the p-type impurities becomes longer than diffusion distances of the p-type impurities in the ranges 110, 120. Thus, the second bottom regions 36b having a high p-type impurity concentration and a thicker thickness are formed in the ranges 130, and the first bottom regions 36a having a low p-type impurity concentration and a thinner thickness are formed in the ranges 110, 120. Thus, according to this method, the MOSFET of the second embodiment can be manufactured. Further, according to this method, separate masks are not required for the ranges 110, 120, 130, but the p-type impurities still can be implanted at a higher concentration in the ranges 130 than in the ranges 110, 120. Due to the lack of the need to form masks for the ranges 110, 120, 130 and remove them therefrom, the MOSFETs can be manufactured efficiently. Notably, the MOSFET of the second embodiment may be manufactured by other methods as well.

Notably, in the aforementioned embodiments, the p-type regions (that is, the end regions 38) for connecting the bottom regions 36 to the body region 32 were provided at the ends of the trenches 22 in the long direction. However, the p-type regions for connecting the bottom regions 36 to the body region 32 may be provided at other positions. Further, the p-type regions for connecting the bottom regions 36 to the body region 32 may be connected to the second bottom regions 36b. Further, the bottom regions 36 may be connected to the upper electrode 70 without intervening the body region 32 therebetween. Further, the p-type regions for connecting the bottom regions 36 to the upper electrode 70 may not be provided. In this case, the potential of the bottom regions 36 becomes floating.

Further, in the aforementioned embodiments, the semiconductor substrate 12 was constituted of SiC. However, the semiconductor substrate 12 may be constituted of Si (silicon). If the semiconductor substrate 12 is constituted of Si, it is preferable to set the effective carrier surface density of the second bottom regions 36b greater than $2.0 \times 10^{12}$ $(cm^{-2})$. According to this configuration, the second bottom regions 36b can be suppressed from being completely depleted in the thickness direction. Further, if the semiconductor substrate 12 is constituted of Si, it is preferable to set the effective carrier surface density of the first bottom regions 36a smaller than $2.0 \times 10^{12}$ $(cm^{-2})$. According to this configuration, the first bottom regions 36a can be completely depleted in the thickness direction when the application voltage to the MOSFET is high.

Further, in the aforementioned first and second embodiments, the description was given based on an n-channel type MOSFET, however, the technique disclosed herein may be adapted to a p-channel type MOSFET. In the aforementioned first and second embodiments, the p-channel type MOSFET can be configured by substituting the n type and the p type. Further, the technique disclosed herein may be adapted to other switching elements such as an IGBT (Insulated Gate Bipolar Transistor).

Relationships between the respective constituent features of the aforementioned embodiments and the respective constituent features of the claims will be described. The source region in the embodiments is an example of a first semiconductor region of the claims. The drift region in the embodiments is an example of a second semiconductor region in the claims. The end region and the body region of the embodiments are examples of a connection region.

Some of the features characteristic to below-described technical elements will herein be listed. It should be noted that the respective technical elements are independent of one another, and are useful solely.

In an example of the configuration disclosed herein, the switching element comprises an upper electrode provided on the upper surface of the semiconductor substrate and being in contact with the first semiconductor region. The semiconductor substrate comprises a second conductivity type connection region connecting the bottom region and the upper electrode.

According to this configuration, since the bottom region is connected to the upper electrode, a potential of the bottom region can be stabilized. Due to this, performance of the switching element can be stabilized. Further, when the switching element turns on, charges are supplied to the bottom region through the connection region. Due to the charges being supplied to the bottom region, a depletion layer expanding from the bottom region to the second semiconductor region shrinks toward a bottom region side. Due to this, a resistance of the second semiconductor region drops. Since the bottom region comprises the second bottom region (that is, a region with a thick thickness and a low resistance), the charges can quickly be supplied to an entirety of the bottom region upon when the switching element turns on. Due to this, the depletion layer can be promptly shrunk from the second semiconductor region to the bottom region. Due to this, an on-resistance of the switching element can promptly be decreased when the switching element turns on.

In an example of the configuration disclosed herein, the gate insulation layer comprises a bottom insulation layer covering the bottom surface of the trench, and a side insulation layer covering a side surface of the trench and a thickness of which is thinner than that of the bottom insulation layer.

According to this configuration, insulation property of the thick bottom insulation layer hardly deteriorates even when an electric field under the trench in a vicinity of a boundary between the first bottom region and the second bottom region becomes high.

In an example of the configuration disclosed herein, the semiconductor substrate is constituted of silicon carbide. An effective carrier surface density obtained by integrating an effective carrier density in the second bottom region that is located below the trench in a thickness direction of the semiconductor substrate is greater than $1.4 \times 10^{13}$ $(cm^{-2})$.

Notably, in the present disclosure, the effective carrier density means a value obtained by subtracting a smaller one of the first conductivity type impurity concentration and the second conductivity type impurity concentration from a larger one in the specific semiconductor region.

According to this configuration, the second bottom region located below the trench will not be depleted over its entirety in the thickness direction. Thus, when the switching element turns on, the charges can be supplied more quickly to the entirety of the bottom region. Due to this, the depletion layer can more promptly be shrunk from the second semiconductor region to the bottom region. Due to this, the on-resistance can more promptly be decreased upon turning on the switching element.

In an example of the configuration disclosed herein, the semiconductor substrate is constituted of silicon carbide. An effective carrier surface density obtained by integrating an effective carrier density in the first bottom region that is located below the trench in a thickness direction of the semiconductor substrate is smaller than $1.4 \times 10^{13}$ (cm$^{-2}$).

According to this configuration, by adjusting the application voltage during when the switching element is off, the first bottom region located under the trench can be completely depleted in the thickness direction. When the first bottom region is depleted completely in the thickness direction, equipotential lines can extend from the first bottom region to the gate insulation layer located thereabove as well. Due to this, the electric field in the vicinities of the ends of the trench in the long direction can further be alleviated.

In an example of the configuration disclosed herein, the semiconductor substrate is constituted of silicon. An effective carrier surface density obtained by integrating an effective carrier density in the second bottom region that is located below the trench in a thickness direction of the semiconductor substrate is greater than $2.0 \times 10^{12}$ (cm$^{-2}$).

According to this configuration, the second bottom region located under the trench will not be depleted over its entirety in the thickness direction. Thus, when the switching element turns on, the on-resistance can more promptly be decreased.

In an example of the configuration disclosed herein, the semiconductor substrate is constituted of silicon. An effective carrier surface density obtained by integrating an effective carrier density in the first bottom region that is located below the trench in a thickness direction of the semiconductor substrate is smaller than $2.0 \times 10^{12}$ (cm$^{-2}$).

According to this configuration, by adjusting the application voltage during when the switching element is off, the first bottom region located under the trench can be completely depleted in the thickness direction. Due to this, the electric field in the vicinities of the ends of the trench in the long direction can further be alleviated.

Specific examples of the present invention have been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

10: MOSFET
12: semiconductor substrate
22: trench
24: gate insulation layer
26: gate electrode
28: interlayer insulation film
30: source region
32: body region
34: drain region
34a: drift region
34b: drain contact region
36: bottom region
36a: first bottom region
36b: second bottom region
38: end region
70: upper electrode
72: lower electrode

The invention claimed is:

1. A switching element comprising:
a semiconductor substrate on an upper surface of which a trench is provided;
a gate insulation layer covering an inner surface of the trench; and
a gate electrode arranged in the trench and insulated from the semiconductor substrate by the gate insulation layer;
wherein the semiconductor substrate comprises:
a first conductivity type first semiconductor region being in contact with the gate insulation layer;
a second conductivity type body region being in contact with the gate insulation layer on a lower side of the first semiconductor region;
a second conductivity type bottom region being in contact with the gate insulation layer at a bottom surface of the trench; and
a first conductivity type second semiconductor region extending from a position being in contact with a lower surface of the body region to a position being in contact with a lower surface of the bottom region, being in contact with the gate insulation layer on a lower side of the body region, and separated from the first semiconductor region by the body region;
the bottom region comprises:
a first bottom region being in contact with the gate insulation layer in a first range of the bottom surface that is positioned at an end in a long direction of the trench, and extending from the bottom surface to a first position lower than the bottom surface; and
a second bottom region being in contact with the gate insulation layer in a second range of the bottom surface that is adjacent to the first range, and extending from the bottom surface to a second position lower than the first position.

2. The switching element according to claim 1, further comprising:
an upper electrode provided on the upper surface of the semiconductor substrate and being in contact with the first semiconductor region,
wherein the semiconductor substrate further comprises a second conductivity type connection region connecting the bottom region and the upper electrode.

3. The switching element according to claim 1, wherein the gate insulation layer comprises:
a bottom insulation layer covering the bottom surface of the trench, and
a side insulation layer covering a side surface of the trench and a thickness of which is thinner than that of the bottom insulation layer.

4. The switching element according to claim 1, wherein the semiconductor substrate is constituted of silicon carbide, and
an effective carrier surface density obtained by integrating an effective carrier density in the second bottom region that is located below the trench in a thickness direction of the semiconductor substrate is greater than $1.4 \times 10^{13}$ (cm$^{-2}$).

5. The switching element according to claim 1, wherein the semiconductor substrate is constituted of silicon carbide, and
- an effective carrier surface density obtained by integrating an effective carrier density in the first bottom region that is located below the trench in a thickness direction of the semiconductor substrate is smaller than $1.4 \times 10^{13}$ $(cm^{-2})$.

6. The switching element according to claim 1, wherein the semiconductor substrate is constituted of silicon, and
- an effective carrier surface density obtained by integrating an effective carrier density in the second bottom region that is located below the trench in a thickness direction of the semiconductor substrate is greater than $2.0 \times 10^{12}$ $(cm^{-2})$.

7. The switching element according to claim 1, wherein the semiconductor substrate is constituted of silicon, and
- an effective carrier surface density obtained by integrating an effective carrier density in the first bottom region that is located below the trench in a thickness direction of the semiconductor substrate is smaller than $2.0 \times 10^{12}$ $(cm^{-2})$.

* * * * *